(12) United States Patent
Behrens et al.

(10) Patent No.: US 8,162,035 B2
(45) Date of Patent: Apr. 24, 2012

(54) HIGH CONDUCTIVITY CERAMIC FOAM COLD PLATE

(75) Inventors: William Webster Behrens, St. Louis, MO (US); Andrew Richard Tucker, Glendale, MO (US)

(73) Assignee: The Boeing Company, Chicago, IL (US)

( * ) Notice: Subject to any disclaimer, the term of this patent is extended or adjusted under 35 U.S.C. 154(b) by 1035 days.

(21) Appl. No.: 12/108,940

(22) Filed: Apr. 24, 2008

(65) Prior Publication Data
US 2008/0196869 A1 Aug. 21, 2008

Related U.S. Application Data

(63) Continuation-in-part of application No. 11/407,438, filed on Apr. 20, 2006, now Pat. No. 7,905,275.

(51) Int. Cl.
*F28F 7/02* (2006.01)
(52) U.S. Cl. ...................... 165/80.4; 165/80.5
(58) Field of Classification Search .................. 165/80.4, 165/80.5; 361/699
See application file for complete search history.

(56) References Cited

U.S. PATENT DOCUMENTS

| | | | |
|---|---|---|---|
| 4,884,168 A * | 11/1989 | August et al. | 361/702 |
| 7,275,720 B2 | 10/2007 | Behrens et al. | |
| 7,710,722 B2 * | 5/2010 | Suzuki et al. | 361/699 |
| 2007/0246191 A1 | 10/2007 | Behrens et al. | |
| 2007/0247812 A1 | 10/2007 | Behrens et al. | |

* cited by examiner

*Primary Examiner* — Teresa Walberg
(74) *Attorney, Agent, or Firm* — McNees Wallace & Nurick LLC

(57) ABSTRACT

A cold plate and method for cooling using the cold plate are disclosed. The cold plate includes a housing having hyperporous, microchannel ceramic foam strips disposed therewithin. A plurality of plugs formed from a high thermal conductivity material are disposed into the ceramic foam strips. Heat is transferred in an extremely efficient manner by leveraging the high thermal conductivity of the plugs to transfer the energy deep into a high internal surface area ceramic foam, which in turn transfers the heat to a coolant via convection. Channels between the foam strips form coolant inlet and outlet plenums, which results in minimal coolant pressure drop through the cold plate. In one example, an exemplary cold plate may provide cooling to one or two printed circuit boards. In another example, a cold plate may be disposed within a heat exchanger housing to provide cooling to a fluid.

27 Claims, 6 Drawing Sheets

HIGH CONDUCTIVITY CERAMIC FOAM COLD PLATE

CROSS REFERENCE TO RELATED APPLICATION

This application is a continuation-in-part of U.S. Utility application Ser. No. 11/407,438, filed Apr. 20, 2006, entitled "CERAMIC FOAM COLD PLATE", which is incorporated herein by reference in its entirety.

FIELD OF THE INVENTION

This invention relates generally to methods and apparatuses for cold plates that are used for convective cooling of high power electronics and avionics. The invention further relates generally to methods and apparatuses employing cold plate designs as heat exchanger cores for high efficiency compact heat exchangers and to methods and apparatuses employing cold plates for cooling of printed circuit boards.

BACKGROUND OF THE INVENTION

Integrated circuit chips, such as micro-processor chips, and other electronic components generate heat during operation. These components are generally mounted on printed circuit boards (PCBs). To help ensure proper operation, these components must generally be kept at an operating temperature below about 160° F. This means that cooling of some sort must ordinarily be provided for proper operation of the electronic components.

Cold plates are widely used for cooling PCBs where the coolant must be kept separated from the electronic components. A cold plate generally consists of an enhanced heat transfer surface encapsulated in a high aspect ratio rectangular duct. The enhanced heat transfer surfaces are typically some sort of fin arrangement or an open-celled, porous metal foam. Coolant flows through the cold plate from one end to the other end, wetting the enhanced heat transfer surface inside. This system cools PCBs mounted to the sides of the cold plate. Finned core stocks and metal foams are used in cold plates because they increase the thermal effectiveness by increasing the surface area available for transferring heat to the coolant. However, surface area densities for finned core stock and metal foams are generally limited to approximately 1000 $ft^2/ft^3$. This is chiefly because surface area densities significantly larger than this value result in unacceptably high pressure drop as the coolant flows through the cold plate. High pressure drop translates into a system penalty in the form of higher power required for pushing the coolant through the cold plate. Furthermore, manufacturing fin and metal foam arrangements with higher surface area densities becomes increasingly costly and complex. These limitations on surface area density ultimately limit the heat that can be absorbed for a given coolant flowrate. In the future, such a limitation will be exacerbated by the introduction of high power electronics, including high power chip designs, because conventional air cooled cold plates will not be able to meet cooling demand. These future electronics are projected to generate significantly more heat than contemporary electronics while still having an operating temperature limit of about 160° F.

When applied to conventional avionics PCB's, conventional cold plates require a large amount of coolant because they are not very efficient. This constitutes a significant penalty for an air vehicle because cooling air generated by the aircraft Environmental Control System (ECS) by cooling and conditioning air extracted from the engine(s) that would otherwise provide thrust to the air vehicle. Metal foam solutions could conceivably meet some future PCB requirements, but they need significantly larger coolant flow rates that are a great burden on the air vehicle.

Cold plates may also be used as heat exchanger cores. Conventional heat exchangers cores are typically heavy, costly brazed plate fin designs made from a high conductivity metal. Likewise, metal foam cores for heat exchanger applications are expensive to construct. Furthermore, the limited thermally efficiency of conventional designs means that a more efficient design would need significantly fewer cores to achieve a particular effectiveness level. Conversely, a more efficient design would give a higher effectiveness for the same number of cores as found in conventional designs. Fewer cores would result in a lighter, less costly heat exchanger that would take up less space on an air vehicle.

In summary, it would be desirable to reduce the amount of air required for cooling conventional avionics by increasing the heat transfer ability of a cold plate, thereby reducing the system performance penalty. It would further be desirable to address cooling of future high power electronics that are projected to generate significantly more heat than contemporary chips while still having an operating temperature limit of about 160° F. It would also be desirable to maximize thermal performance of a cold plate while mitigating change in pressure drop through the cold plate. It would be desirable with regard to heat exchangers to either reduce the number of cold plates needed to achieve a certain effectiveness, or to achieve a higher effectiveness for a given number of cold plates.

The foregoing examples and limitations associated therewith are intended to be illustrative and not exclusive. Other limitations of the related art will become apparent to those of skill in the art upon reading of the specifications and study of the drawings.

SUMMARY OF THE INVENTION

The following embodiments and aspects thereof are described and illustrated in conjunction with systems and methods that are meant to be exemplary and illustrative, not limiting in scope. In various embodiments, one or more of the problems described above in the Background have been reduced or eliminated, while other embodiments are directed to other improvements.

An exemplary embodiment of the invention includes an exemplary cold plate including a housing defining an inlet port and an outlet port, and a plurality of foam strips are disposed in the housing. Each of the foam strips includes a ceramic foam having a pore size of no more than about 50 micrometers and a porosity of at least about 80 percent and a plurality of plugs made from a high thermal conductivity material. The plurality of plugs is inserted into the ceramic foam. The plurality of foam strips containing the plurality of plugs is arranged within the housing such that coolant is flowable through a width of the foam strips.

Another exemplary embodiment of the invention includes a method of cooling. The method includes flowing a coolant into a housing, and flowing the coolant across widths of a plurality of foam strips disposed within the housing. The foam strips include a ceramic foam having a pore size of no more than about 50 micrometers and a porosity of at least about 80 percent and a plurality of conductive plugs, and discharging the coolant from the housing.

In yet another exemplary embodiment of the invention, a circuit board assembly is disclosed that includes at least one circuit board having first and second sides, the circuit board having at least one printed circuit mounted on the first side of the circuit board, and a cold plate having a first and a second side, the first side of the cold plate being attached in thermal communication to the second side of the circuit board. The cold plate includes a housing defining an inlet port and an outlet port, and a plurality of foam strips disposed in the housing. Each of the foam strips includes a ceramic foam having a pore size of no more than about 50 micrometers and a porosity of at least about 80 percent and a plurality of plugs made from a high thermal conductivity material. The plurality of foam strips being arranged within the housing such that coolant is flowable through a width of the foam strips.

In still another exemplary embodiment of the invention, a heat exchanger is disclosed that includes a heat exchanger housing that defines at least one heat exchanger inlet port for a first fluid and at least one heat exchanger outlet port for the first fluid. At least one exemplary cold plate is disposed within the heat exchanger housing intermediate the heat exchanger inlet port and the heat exchanger outlet port such that the first fluid flows over one surface of the cold plate and then an opposite surface of the cold plate. The exemplary cold plate includes a cold plate housing defining at least a first cold plate inlet port for a second fluid and at least a first cold plate outlet port for the second fluid, and at least a first plurality of foam strips containing plugs disposed in the cold plate housing. Each of the foam strips has a pore size of no more than about 50 micrometers and a porosity of at least about 80 percent and a plurality of plugs made from a high thermal conductivity material. The foam strips are arranged within the cold plate housing such that the second fluid is flowable through a width of the foam strips.

One advantage of the present invention includes improved cooling compared to plate fin and aluminum foam cold plates.

Another advantage of the present invention includes maximizing thermal performance of a cold plate while mitigating change in pressure drop through the cold plate.

Further aspects of the method and apparatus are disclosed herein. Other features and advantages of the present invention will be apparent from the following more detailed description of the preferred embodiment, taken in conjunction with the accompanying drawings that illustrate, by way of example, the principles of the invention. The features, functions, and advantages of the present invention can be achieved independently in various embodiments of the present inventions or may be combined in yet other embodiments.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete and will fully convey the scope of the invention to those skilled in the art. All composition percents are given as weight percents, unless otherwise specified.

Figure 1A:
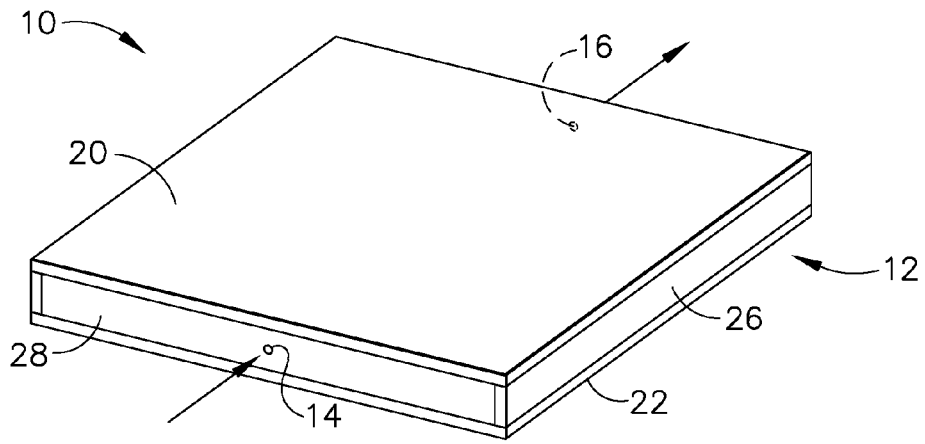
FIG. 1A is a perspective view of an exemplary ceramic foam cold plate.
Figure 1B:
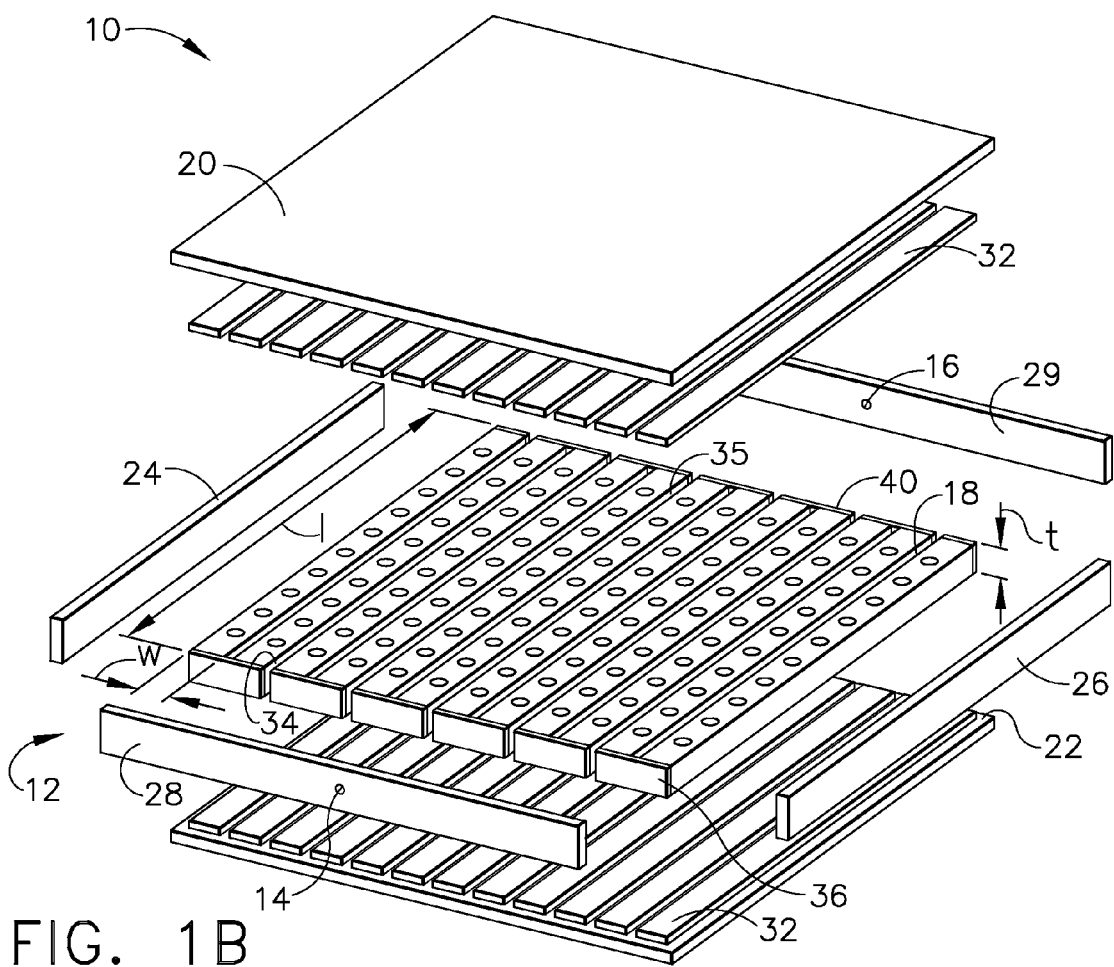
FIG. 1B is an exploded perspective view of the exemplary ceramic foam cold plate of FIG. 1A.

Referring to FIGS. 1A and 1B, an exemplary embodiment of a cold plate 10 is shown. The cold plate 10 includes a housing 12 and a plurality of ceramic foam strips 18 disposed within the housing 12. The housing 12 includes a top and bottom cover plates 20, 22 respectively, side plates 24 and 26, a front manifold plate 28 and a rear manifold plate 29. The front manifold plate 28 includes an inlet port 14, and the rear manifold plate 29 includes an outlet port 16.

The housing 12 is formed of a conductive material, for example aluminum, an aluminum alloy, or other metal alloy. In one embodiment, the housing 12 is formed of an aluminum alloy. In alternative embodiments, the housing 12 may be formed of any lightweight material with acceptable heat transfer properties as desired for a particular application. For example, the housing 12 may be formed of copper, silicon, or a polymer.

The top and bottom cover plates 20, 22 are bonded to the ceramic foam strips 18 by a thermally conductive adhesive 32 applied between the foam strips 18 and the cover plates 20 and 22. The thermally conductive adhesive 32 ensures that all coolant flows through the ceramic foam 18 rather than between the top and bottom cover plates 20, 22 and the ceramic foam 18. Given by way of non-limiting example, in one exemplary embodiment the thermally conductive adhesive 32 is a silicone room temperature vulcanizing (RTV) sealant. However, the adhesive may be any adhesive with thermal conductivity characteristics that are acceptable for a particular application as desired. Another non-limiting example of an adhesive is a conductive epoxy.

The top and bottom cover plates 20, 22 may be in contact with a device to transfer heat from the device to a cooling fluid passing through the cold plate 10. In one embodiment, a PCB is cooled by contacting the PCB to either the top cover plate 20 or the bottom cover plate 22. In another embodiment, a first PCB is cooled by contacting the first PCB with the top cover plate 20, and contacting a second PCB with the bottom cover plate 22.

Figure 1C:
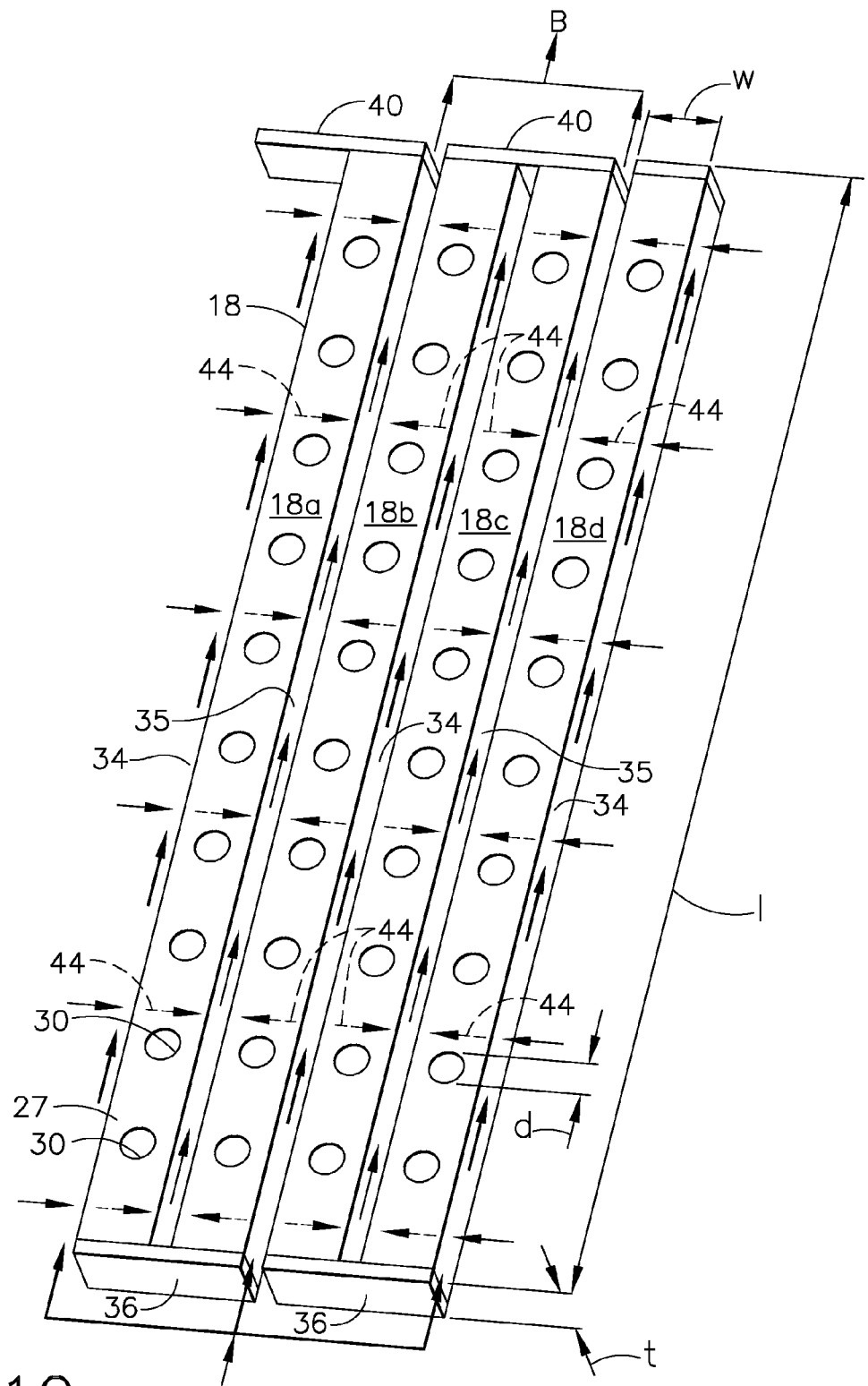
FIG. 1C illustrates details of features of the exemplary ceramic foam cold plate of FIGS. 1A and 1B.

Referring to FIG. 1C, the ceramic foam strips 18 include a high internal surface area ceramic foam material 27 and high thermal conductivity plugs 30. The ceramic foam material 29 has a pore size of no more than about 50 μm and a porosity of at least about 80 percent. According to one aspect of the disclosure, the pore size may be about 35 μm. According to another aspect of the disclosure, the porosity may be about 90 percent. The ceramic foam material 27 may be a hyperporous, microchannel alumina silica ceramic foam that includes silica, alumina, and aluminoborosilicate fibers. For example, the ceramic foam material 27 may be Boeing Rigid Insulation™ (BRI), which is a combination of silica and alumina fibers, and boron carbide. The boron carbide allows for more effective bonding of the fibers of the insulation. Furthermore, BRI is produced in a manner that orients the fibers in a plane roughly perpendicular to the flow of heat through the foam. BRI foam may have a porosity of between 90 and 96%, a pore size of about 35 μm and an internal surface area of about 31,000 ft$^2$/ft$^3$.

The plugs 30 are disposed in the ceramic foam strips 18 at regular intervals. In this exemplary embodiment, ten plugs 30 are disposed at regular intervals in each ceramic foam strip 18. The plugs 30 transfer heat from the top and/or bottom covers 20, 22, into the bulk of the ceramic foam strips 18, that in turn transfer heat to a provided coolant via convection. The plugs thereby greatly improve the thermal efficiency of the ceramic foam strips 18 in transferring heat to the coolant. In addition to improving thermal efficiency, the plugs 30 may provide structural support to the cold plate 10.

Figure 2:
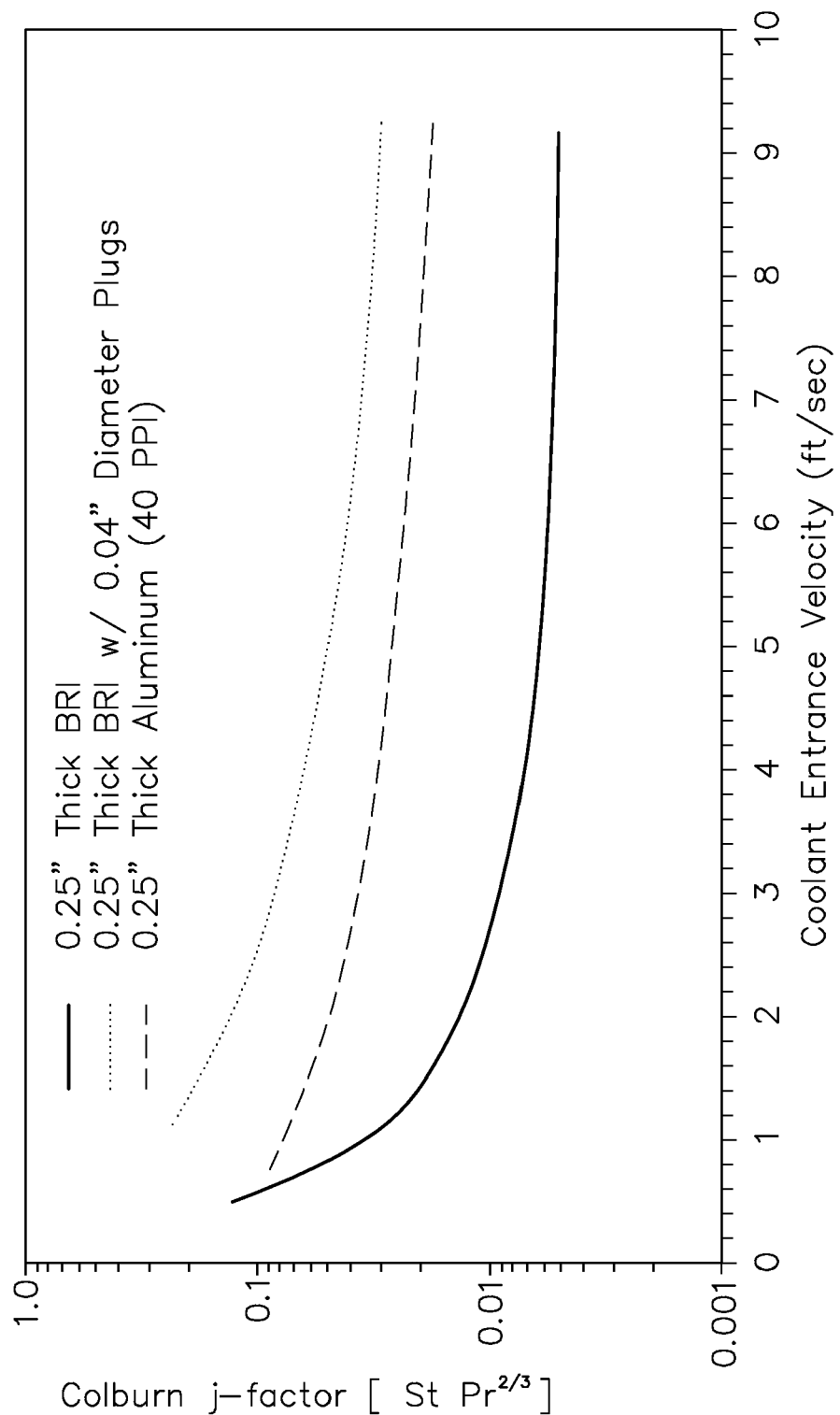
FIG. 2 is a chart illustrating thermal test data comparing the thermal efficiency of ceramic foam strips including plugs to ceramic foam strips and aluminum.

The improved thermal efficiency of ceramic foam strips 18 including plugs 30 is illustrated by the thermal test data shown in FIG. 2. A comparison of Colburn j-factor as a function of coolant inlet velocity is given for cold plates consisting of each of split flow plenum BRI with conductive aluminum nitride plugs, split flow plenum BRI without plugs, and conventional aluminum foam that is not configured with split flow plenums. The Colburn j-factor quantifies the convective heat transfer efficiency of a given cold plate design with a higher Colburn j-factor corresponding to higher convective heat transfer. The test data clearly show that a cold plate employing split flow plenum BRI ceramic foam with conductive plugs is superior to both a cold plate using split flow plenum BRI ceramic foam only and a conventional aluminum foam design.

In this exemplary embodiment, the plugs 30 have a cylindrical geometry. However, in other alternative embodiments, the plugs 30 may be non-circular or may be replaced with square or rectangular slots that span the width of the foam strip. In this exemplary embodiment, the plugs 30 may have a diameter d of approximately ½ w However, in alternative embodiments, the plugs 30 may have any diameter d that provides the required thermal efficiency to the ceramic foam strips 18 for the number of plugs 30 provided.

The plugs 30 may be formed from a material having a low electrical conductivity for compatibility with the PCBs, and having a high thermal conductivity to efficiently conduct heat. For example, highly conductive plugs 30 may be formed from boron nitride (BN), aluminum nitride (AlN), and alumina (Al2O3). According to one aspect of the disclosure, the plugs 30 may be formed of BN. The plugs 30 may be formed into the ceramic foam strips 18 by forming the ceramic foam 29 around the plugs 30. Alternatively, the plugs 30 may be inserted into holes formed into the ceramic foam strips 18. In one embodiment of the disclosure, the plugs 30 may be formed in the ceramic foam strips 18 by first forming holes or slots into the ceramic foam strips 18 by punching, drilling, machining or similar methods, and then disposing a BN ceramic adhesive into the holes or slots. The BN adhesive is then dried to form the plugs 30 in the ceramic foam strips 18. In one exemplary embodiment, the BN adhesive is Ceramabond™ 690 produced by Aremco Products, Inc., U.S.A.

Still referring to FIG. 1C, the foam strips 18 have a length l. a thickness t and a width w. The width w is defined as the dimension that the coolant substantially flows through the foam strips 18. In one embodiment, the foam strips 18 have a length l ranging from about 1 inch to about 18 inches, a thickness t of less than about 1 inch, and a width w of less than about 0.5 inches. The dimensions depend on the particular application. Given by way of a non-limiting example, the foam strips 18 may have a length l of approximately 6 inches, a thickness t of approximately 0.25 inches and a width w of approximately 0.25 inches. The majority of the heat transfer to the coolant occurs as the coolant flows through the width w of the foam strips 18. Additional heat may be transferred to the coolant as the coolant contacts the top and bottom cover plates 20, 22.

As shown in FIGS. 1B and 1C, at least one end cap 36 is attached to adjacent foam strips proximate the front manifold plate 28 and at least one end cap 40 is attached to adjacent foam strips proximate the rear manifold plate 29. The end caps 36, 40 distribute coolant from the inlet 14 into the inlet plenums 34 and direct coolant from the outlet plenums 35 into the outlet 16, respectively. End caps 36, 40 are formed by applying a coolant barrier to the ends of adjacent foam strips 18. The end caps 36, 40 may be formed of a metal such as aluminum or of ceramic foam sealed with RTV or other similar sealant material.

As shown in FIG. 1C, coolant enters the inlet port 14 and is channeled, due to the end caps 36, into the inlet plenums 34. The direction of the flow of coolant from the inlet port 14 to the inlet plenums 34 is indicated by arrow A. End cap 40 prevents the coolant from exiting the inlet plenums 34, thereby forcing the coolant through the width w of the foam strips 18 as indicated by arrows 44. After the coolant has flowed through the width w of the foam strips 18, the coolant enters the outlet plenums 35. The end caps 36 prevent the coolant from exiting the outlet plenums 35, and directs the coolant to the outlet port 16, from which the coolant is discharged from the cold plate 10. The direction of flow of coolant from the outlet plenums 35 through the outlet port 16 is indicted by arrow B. The inlet plenums 34 and the outlet plenums 35 provide several channels for coolant to flow into and out of the several foam strips 18, respectively, thereby advantageously helping to reduce pressure drop across the cold plate 10. In an exemplary embodiment, the pressure drop across the cold plate 10, when air is used as the coolant, is merely on the order of inches of water. For example, the pressure drop across the cold plate 10 may be less than fourteen inches of water.

Figure 3A:
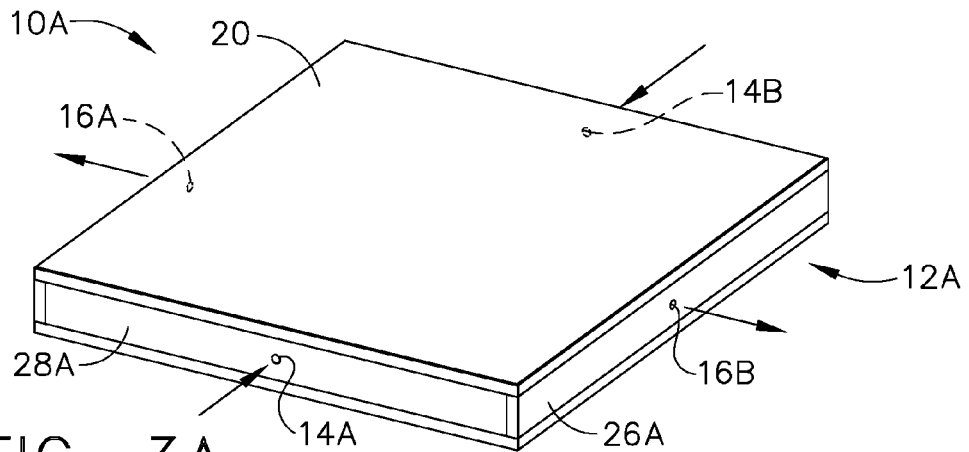
FIG. 3A is a perspective view of another exemplary ceramic foam cold plate.
Figure 3B:
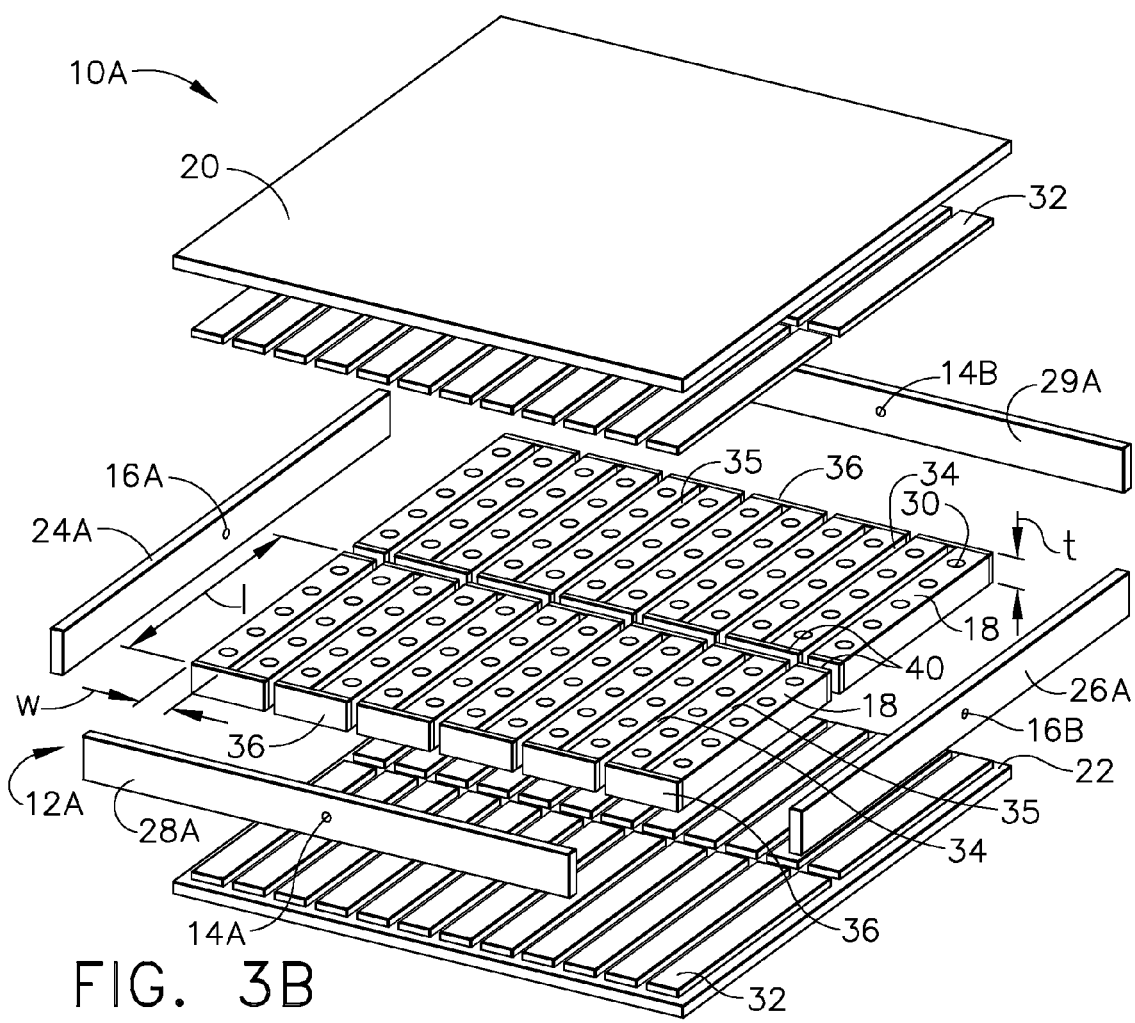
FIG. 3B is an exploded view of the exemplary ceramic foam cold plate of FIG. 3A.

Referring now to FIGS. 3A and 3B, another exemplary cold plate 10A includes the foam strips 18. The cold plate 10A is well-suited for use in applications, such as heat exchangers, that entail larger heart transfer surface areas than do printed circuit boards. Thus, the cold plate 10A may also be referred to as a heat exchanger plate. Cooling air is introduced on each end of the cold plate 10A to maximize cooling efficiency by minimizing the temperature rise experienced by the cold plate 10A. A housing 12A defines inlet ports 14A and 14B and outlet ports 16A and 16B. The housing 12A includes two pluralities of the foam strips 18 including plugs 30 that have been discussed in detail above. The pluralities of foam strips 18 are arranged within the housing 12A such that coolant flows through a width w of the foam strips 18 as discussed above in connection with FIG. 1C.

Still referring to FIGS. 3A and 3B, the housing 12A is made of the top and bottom cover plates 20 and 22, side plates 24A and 26A, and end plates 28A and 29A. The end plates 28A and 29A define the inlet ports 14A and 14B respectively, for receiving the coolant as described above. The side plates 24A and 26A define the outlet ports 16A and 16B respectively, for discharging the coolant from the cold plate 10A. The thermal sealant 32 physically connects the top cover plate 20 with the foam strips 18 and the bottom cover plate 22 with the foam strips 18.

In the same manner as described above in connection with FIG. 1C, the end caps 36 are attached to ends of the foam strips 18 near the inlet ports 14A and 14B and the end caps 40 are attached to the other ends of the foam strips 18. Thus, coolant flows into the inlet ports 14A and 14B, is channeled into the inlet plenums 34, flows through the widths of the foam strips 18, is channeled through the outlet plenums 35, meets in the mid-plane of the cold plate 10A, splits and is discharged from the cold plate 10A via the outlet ports 16A and 16B.

Figure 4:
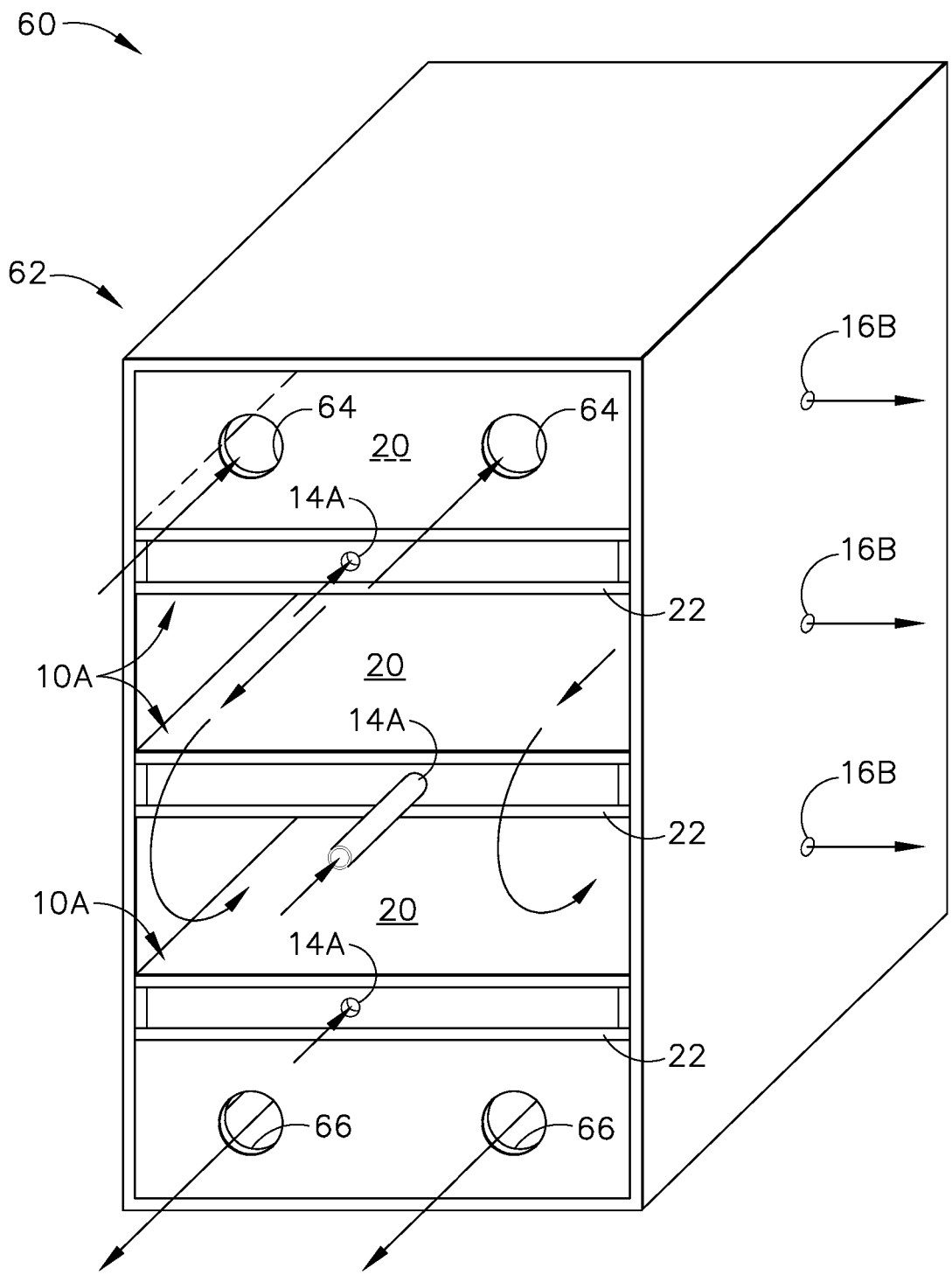
FIG. 4 is a perspective view in partial schematic form of an exemplary heat exchanger.

An exemplary heat exchanger 60 including cold plates 10A as heat exchanger plates is shown in FIG. 4. The heat exchanger 60 is a multiple pass heat exchanger. In an exemplary, non-limiting application, the heat exchanger 60 may use ram air from outside an aircraft to cool the air used for avionics cooling. Other aerospace applications for the heat exchanger 60 may include cooling engine oil/fuel and condensing ECS refrigerant. A heat exchanger housing 62 defines inlet ports 64 for receiving the fluid needing cooling, and outlet ports 66 for discharging the cooled fluid. The heat exchanger plates 10A are mounted within the housing 62 between the inlet ports 64 and the outlet ports 66 so the fluid needing cooling flows directly over the top cover plate 20 and the bottom cover plate 22 of the heat exchanger plates 10A mounted within the housing 62. Heat from the fluid entering the inlet ports 64 of the heat exchanger plates 10A is transferred to the coolant (or fluid) which enters the heat exchanger plate via inlet ports 14A. The heated coolant (or fluid) is discharged from the heat exchanger plates 10A via the outlet ports 16B. As a result of the superior cooling capabilities of the cold plates 10A, the heat exchanger 60 can be more compact and lighter than conventional heat exchangers, thereby reducing system penalties. In this exemplary embodiment, the heat exchanger 60 includes three cold plates 10A, however, it should be appreciated by one of ordinary skill in the art that the heat exchanger 60 may include any number of cold plates 10A depending upon system cooling requirements. Additionally, it should be further appreciated by one of ordinary skill that the heat exchanger 60 is not limited to including cold plates 10A, but may include other cold plate designs in accordance with the present invention, such as for example, cold plates 10.

Figure 5:
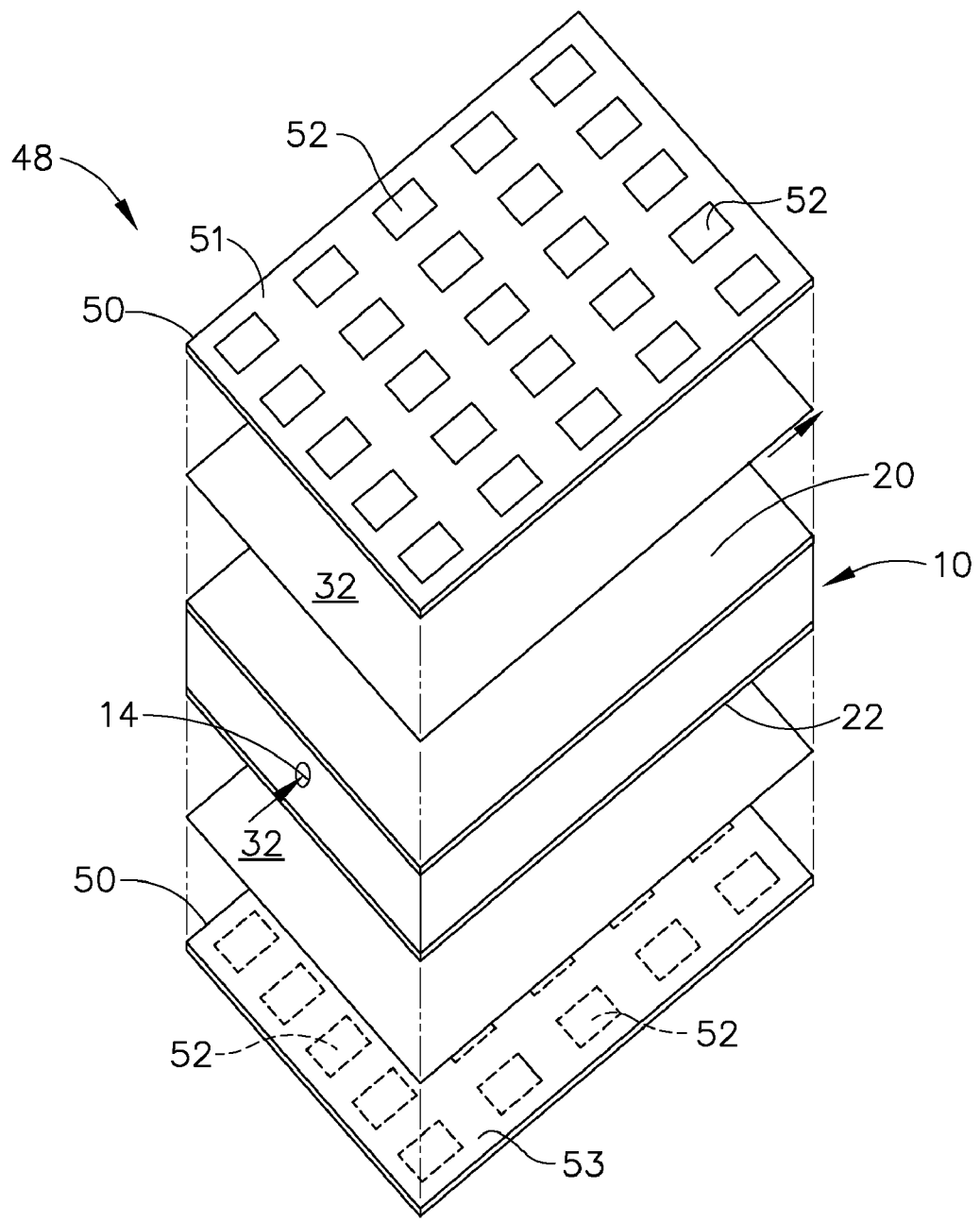
FIG. 5 is a partially exploded view of an exemplary printed circuit board assembling including a cold plate.

An exemplary circuit board assembly 48 including a cold plate 10 and printed circuit boards (PCBs) 50 is shown in FIG. 5. PCBs 50 include a first surface 51 and a second surface 53. Electronic components 52 are mounted on the first surface 51 of the PCBs 50 as would be appreciated by one of ordinary skill in the art. Electronic components 52 may include printed circuits and other electronic devices. The second surfaces of PCBs 50 are bonded to the top and bottom cover plates 20, 22 using a thermal adhesive 32. Thermal adhesive 32 may be a silicone room temperature vulcanizing (RTV) sealant. More generally, the thermal adhesive 32 may be any adhesive with thermal conductivity characteristics that are acceptable for a particular application as desired. Another non-limiting example of a thermal adhesive 32 is a conductive epoxy.

The cold plate 10 provides cooling to the printed circuit boards 50 by transferring heat from the printed circuit boards 50 into the cold plate 10, and removing the transferred heat by a coolant passed through the cold plate 10 as indicated by the arrows. In another embodiment, only one PCB 50 may be bonded to either the top or bottom cover plates 20, 22. Furthermore, while the PCBs 50 are shown bonded at a second surface 53, the PCBs may be bonded to the cold plate 10 at any PCB surface.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. It is therefore further intended that the following appended claims and claims hereafter introduced are interpreted to include all such modifications, permutations, additions, and sub-combinations as are within their true spirit and scope.

The invention claimed is:

1. A cold plate comprising:
   a housing defining at inlet port and an outlet port; and
   a plurality of foam strips disposed in the housing, each of the foam strips comprising a ceramic foam having a pore size of no more than about 50 micrometers and a porosity of at least about 80 percent and a plurality of thermally conductive plugs disposed in the ceramic foam, the plurality of foam strips configured within the housing such that a coolant provided to the cold plate flows through a width of the foam strips.

2. The cold plate of claim 1, wherein the pore size is about 35 micrometers and the porosity is about 90 percent.

3. The cold plate of claim 1, wherein the ceramic foam comprises silica, aluminum oxide, and aluminoborosilicate fibers.

4. The cold plate of claim 1, wherein the conductive plugs are formed from a material selected from the group comprising boron nitride, aluminum nitride, and alumina.

5. The cold plate of claim 1, further comprising a plurality of plenums disposed within the housing between the foam strips.

6. The cold plate of claim 1, wherein the conductive plugs extend through the foam strips and are in thermal communication with the top and bottom cover plates of the cold plate housing.

7. A method of cooling, the method comprising:
   flowing a coolant into a housing;
   flowing the coolant across widths of a plurality of foam strips disposed within the housing, the foam strips comprising a ceramic foam having a pore size of no more than about 50 micrometers and a porosity of at least about 80 percent and a plurality of conductive plugs; and
   discharging the coolant from the housing.

8. The method of claim 7, further comprising providing the coolant to the plurality of foam strips via a plurality of plenums.

9. The method of claim 7, wherein the ceramic foam comprises silica, aluminum oxide, and aluminoborosilicate fibers.

10. The method of claim 7, wherein the conductive plugs are formed from a material selected from the group comprising boron nitride, aluminum nitride, and alumina.

11. The method of claim 7, further comprising a plurality of plenums disposed within the housing between the foam strips.

12. The method of claim 7, wherein the conductive plugs extend through the foam strips and are in thermal communication with the top and bottom cover plates of the cold plate housing.

13. The method of claim 7, further comprising thermally contacting an electronic component with the housing.

14. The method of claim 7, wherein the coolant is air.

15. The method of claim 7, further comprising cooling a fluid by contacting the fluid with the housing.

16. A circuit board assembly comprising:
   at least one circuit board having a first surface and a second surface, the circuit board having at least one printed circuit mounted on the first surface of the circuit board; and
   a cold plate comprising a housing having a top and a top and bottom cover plates, the bottom cover plate in thermal communication with the second surface of the at least one circuit board;
   wherein the cold plate further comprises a plurality of foam strips disposed in the housing, each of the foam strips comprising a ceramic foam having a pore size of no more than about 50 micrometers and a porosity of at least about 80 percent and a plurality of conductive plugs, the plurality of foam strips configured within the housing such that a coolant provided to the cold plate flows through a width of the foam strips.

17. The circuit board assembly of claim 16, further comprising a second circuit board including a first surface and a second surface, the second circuit board having at least one printed circuit board mounted on the first surface, the top cover plate in thermal communication with the second surface of the second circuit board.

18. The circuit board assembly of claim 16, wherein the ceramic foam has a pore size of about 35 micrometers and the porosity is about 90 percent.

19. The circuit board assembly of claim 16, wherein the ceramic foam comprises silica, aluminum oxide, and aluminoborosilicate fibers.

20. The circuit board assembly of claim 16, wherein the conductive plugs are formed from a material selected from the group comprising boron nitride, aluminum nitride, and alumina.

21. A heat exchanger comprising:
a heat exchanger housing having at least one heat exchanger inlet port for a first fluid and at least one heat exchanger outlet port for the first fluid; and
at least one cold plate disposed within the heat exchanger housing intermediate the heat exchanger inlet port and the heat exchanger outlet port, such that the first fluid is flowable in thermal communication with the cold plate; wherein the cold plate comprises:
   a cold plate housing defining at least a first cold plate inlet port for a second fluid and at least a first cold plate outlet port for the second fluid; and
   a plurality of foam strips disposed in the cold plate housing, each of the foam strips comprising a ceramic foam having pore size of no more than about 50 micrometers and a porosity of at least about 80 percent and a plurality of conductive plugs disposed in the ceramic foam, the plurality of foam strips configured within the housing such that a coolant provided to the cold plate flows through a width of the foam strips.

22. The heat exchanger of claim 20, wherein:
the cold plate housing further includes a second cold plate inlet port for the second fluid and a second cold plate outlet port for the second fluid; and
the cold plate further includes a second plurality of foam strips containing thermally conductive plugs, the first and second pluralities of such foam strips being arranged within the housing such that the second fluid from the first cold plate inlet is flowable through widths of the foam strips in the first plurality of foam strips and the second fluid from the second cold plate inlet is flowable through widths of the foam strips in the second plurality of foam strips.

23. The heat exchanger of claim 21, wherein the pore size is about 35 micrometers and the porosity is about 90 percent.

24. The heat exchanger of claim 21, wherein the ceramic foam comprises silica, aluminum oxide, and aluminoborosilicate fibers.

25. The heat exchanger of claim 21, wherein the plugs are formed from a material selected from the group comprising boron nitride, aluminum nitride, and alumina.

26. The heat exchanger of claim 21, further comprising a plurality of plenums disposed within the housing.

27. The heat exchanger of claim 21, wherein the conductive plugs extend through the foam strips and are in thermal communication with the top and bottom cover plates of the cold plate housing.

* * * * *